(12) United States Patent
Kurunczi et al.

(10) Patent No.: US 11,967,489 B2
(45) Date of Patent: Apr. 23, 2024

(54) APPARATUS AND TECHNIQUES FOR ANGLED ETCHING USING MULTIELECTRODE EXTRACTION SOURCE

(71) Applicant: APPLIED Materials, Inc., Santa Clara, CA (US)

(72) Inventors: Peter F. Kurunczi, Cambridge, MA (US); Morgan Evans, Manchester, MA (US); Joseph C. Olson, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 222 days.

(21) Appl. No.: 17/514,657

(22) Filed: Oct. 29, 2021

(65) Prior Publication Data

US 2022/0051880 A1 Feb. 17, 2022

Related U.S. Application Data

(62) Division of application No. 16/682,888, filed on Nov. 13, 2019, now Pat. No. 11,195,703.

(Continued)

(51) Int. Cl.
*H01J 37/32* (2006.01)
*G02B 5/18* (2006.01)
*H01J 37/147* (2006.01)

(52) U.S. Cl.
CPC ...... *H01J 37/32568* (2013.01); *G02B 5/1857* (2013.01); *H01J 37/147* (2013.01); *H01J 37/32541* (2013.01); *H01J 2237/3341* (2013.01)

(58) Field of Classification Search
None
See application file for complete search history.

(56) References Cited

U.S. PATENT DOCUMENTS

| 4,153,529 A | 5/1979 | Little et al. |
| 4,450,031 A * | 5/1984 | Ono .................. H01J 27/14 |
| | | 118/620 |

(Continued)

FOREIGN PATENT DOCUMENTS

| EP | 0562848 A2 | 9/1993 |
| JP | S63271856 A | 11/1988 |

(Continued)

OTHER PUBLICATIONS

6cm×66cm RF Ion Source, Provides Highly Uniform Ion Beam Processing of Large-Scale Substrates, http://www.veeco.com/products/6cm-x-66cm-rf-ion-source, downloaded May 11, 2021; 2 pages.

(Continued)

*Primary Examiner* — Shamim Ahmed
(74) *Attorney, Agent, or Firm* — KDW Firm PLLC

(57) ABSTRACT

A plasma source may include a plasma chamber, where the plasma chamber has a first side, defining a first plane and an extraction assembly, disposed adjacent to the side of the plasma chamber, where the extraction assembly includes at least two electrodes. A first electrode may be disposed immediately adjacent the side of the plasma chamber, wherein a second electrode defines a vertical displacement from the first electrode along a first direction, perpendicular to the first plane, wherein the first electrode comprises a first aperture, and the second electrode comprises a second aperture. The first aperture may define a lateral displacement from the second aperture along a second direction, parallel to the first plane, wherein the vertical displacement and the lateral displacement define a non-zero angle of inclination with respect to a perpendicular to the first plane.

10 Claims, 6 Drawing Sheets

Related U.S. Application Data

(60) Provisional application No. 62/776,734, filed on Dec. 7, 2018, provisional application No. 62/776,722, filed on Dec. 7, 2018.

(56) References Cited

U.S. PATENT DOCUMENTS

| | | |
|---|---|---|
| 4,734,158 A | 3/1988 | Gillis |
| 4,874,459 A | 10/1989 | Coldren et al. |
| 8,101,510 B2 | 1/2012 | Godet et al. |
| 8,664,098 B2 | 3/2014 | Godet et al. |
| 8,835,879 B1 | 9/2014 | Sinclair et al. |
| 9,706,634 B2 | 7/2017 | Liang et al. |
| 10,879,055 B2 | 12/2020 | Hatem et al. |
| 11,715,621 B2 | 8/2023 | Kurunczi |
| 2002/0170675 A1 | 11/2002 | Libby |
| 2006/0019477 A1 | 1/2006 | Hanawa |
| 2006/0042752 A1 | 3/2006 | Rueger |
| 2006/0260750 A1 | 11/2006 | Rueger |
| 2007/0181820 A1 | 8/2007 | Hwang et al. |
| 2008/0087631 A1 | 4/2008 | Hattori |
| 2008/0132046 A1 | 6/2008 | Walther |
| 2008/0179186 A1 | 7/2008 | Shimura et al. |
| 2009/0098306 A1 | 4/2009 | Druz et al. |
| 2010/0255683 A1 | 10/2010 | Godet et al. |
| 2013/0206583 A1 | 8/2013 | Druz et al. |
| 2015/0011093 A1 | 1/2015 | Singh et al. |
| 2015/0255243 A1 | 9/2015 | Godet et al. |
| 2015/0311073 A1 | 10/2015 | Srinivasan et al. |
| 2016/0035539 A1 | 2/2016 | Sainiemi et al. |
| 2016/0064232 A1 | 3/2016 | Berry, III |
| 2016/0071734 A1 | 3/2016 | Graf et al. |
| 2016/0189935 A1 | 6/2016 | Biloiu et al. |
| 2017/0062181 A1 | 3/2017 | Berry, III |
| 2017/0178866 A1 | 6/2017 | Radovanov et al. |
| 2017/0250221 A1 | 8/2017 | Hayashi et al. |
| 2018/0076007 A1 | 3/2018 | Gilchrist et al. |
| 2018/0122650 A1 | 5/2018 | Ma |

FOREIGN PATENT DOCUMENTS

| | | |
|---|---|---|
| JP | H06-163465 A | 6/1994 |
| JP | 2002-075968 A | 3/2002 |
| JP | 2005055773 A | 3/2005 |
| JP | 2012523120 A | 9/2012 |
| JP | 6118458 B1 | 3/2017 |
| JP | 2017-533542 A | 11/2017 |
| JP | 2018-529224 A | 10/2018 |
| KR | 20060085049 A | 7/2006 |
| TW | 201628045 A | 8/2016 |
| WO | 2008054013 A1 | 5/2008 |
| WO | 2010115110 A2 | 10/2010 |
| WO | 2018048566 A | 3/2018 |

OTHER PUBLICATIONS

Kuritzky et al., "Chemically assisted ion beam etching of laser diode facets on nonpolar and semipolar orientations of GaN,"; Semiconductor Science and Technology, vol. 31, No. 7, Published Jun. 13, 2016, Semicond. Sci. Technol. 31 075008, (http://iopscience.iop.org/article/10.1088/0268-1242/31/7/075008), downloaded May 6, 2021; 8 pages.

http://www.mtu.edu/microfabrication/capabilities/plasma/images/caibe-diagram-800banner.jpg; downloaded May 5, 2021; 1 page.

http://nebula.wsimg.com/1aae02780d27abbbb74aa375a5301e2b?AccessKeyId=3D7549092B5B83FF0E81&disposition=0&alloworigin=1, "Classic Gridless Ion Beam Sources", downloaded May 6, 2021; 6 pages.

International Search Report and Written Opinion for the International Patent Application No. PCT/US2019/064684, dated Mar. 24, 2020, 9 pages.

International Search Report and Written Opinion for the International Patent Application No. PCT/US2019/064475, dated Mar. 20, 2020, 8 pages.

* cited by examiner

US 11,967,489 B2

APPARATUS AND TECHNIQUES FOR ANGLED ETCHING USING MULTIELECTRODE EXTRACTION SOURCE

RELATED APPLICATIONS

This application is a Divisional of and claims priority to U.S. Non-Provisional patent application Ser. No. 16/682,888, filed Nov. 13, 2019, entitled "APPARATUS AND TECHNIQUES FOR ANGLED ETCHING USING MULTIELECTRODE EXTRACTION SOURCE" which claims priority to U.S. Provisional patent application No. 62/776,722, filed Dec. 7, 2018, entitled "CONTINUOUS RIBBON SOURCE OF CO-LINEAR RADICAL AND ION FLUX", and further claims priority to U.S. Provisional patent application No. 62/776,734, filed Dec. 7, 2018, entitled "TUNABLE MEAN ANGLE ION BEAM PROCESSING SYSTEM HAVING VARIABLE TRIODE AND HIGHER ELEMENTS AND NOVEL STRUCTURES GENERATED", each of which applications are incorporated by reference herein in their entirety.

FIELD

This disclosure relates to substrate processing to generate angled structures, including optical elements, and more particularly to approaches for apparatus and techniques for forming surface relief gratings.

BACKGROUND

Processing of substrates to generate angled structures, such as angled trenches, angled gratings involves several challenges as well as opportunities. As an example, optical elements such as optical lenses have long been used to manipulate light for various advantages. Optical elements may be produced using angled surface relief optical gratings that can be produced by the direct etching of angled trenches into a substrate or a film stack on a substrate. Control of the angle of the sidewalls of features of the optical gratings may be called for in order to improve grating properties.

With respect to these and other considerations, the present disclosure is provided.

BRIEF SUMMARY

In one embodiment, a plasma source is provided. The plasma source may include a plasma chamber, the plasma chamber comprising a first side, defining a first plane and an extraction assembly, disposed adjacent to the side of the plasma chamber, the extraction assembly comprising at least two electrodes. A first electrode may be disposed immediately adjacent the side of the plasma chamber, wherein a second electrode defines a vertical displacement from the first electrode along a first direction, perpendicular to the first plane, wherein the first electrode comprises a first aperture, and the second electrode comprises a second aperture. The first aperture may define a lateral displacement from the second aperture along a second direction, parallel to the first plane, wherein the vertical displacement and the lateral displacement define a non-zero angle of inclination with respect to a perpendicular to the first plane.

In another embodiment, a method of patterning a substrate is provided. The method may include providing the substrate, wherein a main surface of the substrate defines a substrate plane, wherein the substrate comprises a grating layer and a base layer, subjacent the grating layer, and generating a plasma in a plasma chamber, adjacent to the substrate. The method may further include applying an extraction voltage to an extraction assembly, adjacent the plasma chamber, the extraction assembly comprising at least two electrodes, wherein the at least two electrodes define an angled extraction tunnel, disposed at a non-zero angle of inclination with respect to a perpendicular to the substrate plane. As such, an angled ion beam may be extracted from the extraction assembly, the angled ion beam defining a non-zero angle of incidence with respect to the substrate plane, wherein the angled ion beam etches the grating layer to form an angled grating.

In a further embodiment, a system may include a plasma chamber, the plasma chamber comprising a first side, defining a first plane. The system may include an extraction assembly, disposed adjacent the side of the plasma chamber, where the extraction assembly includes at least two electrodes, wherein the at least two electrodes define an angled extraction tunnel, disposed at a non-zero angle of inclination with respect to a perpendicular to the substrate plane. The system may also include a substrate stage, configured to support a substrate, wherein a main surface of the substrate defines a substrate plane, parallel to the first plane, where the substrate stage is further configured to scan the substrate with respect to the angled extraction tunnel. The system may also include an extraction power supply, coupled to the extraction assembly, and arranged to apply a voltage, wherein an angled ion beam is directed to the substrate through the extraction assembly when a plasma is present in the plasma chamber, the angled ion beam defining a non-zero angle of incidence with respect to the first plane.

BRIEF DESCRIPTION OF THE DRAWINGS

The accompanying drawings illustrate exemplary approaches of the disclosure, including the practical application of the principles thereof, as follows.

Figure 1A:
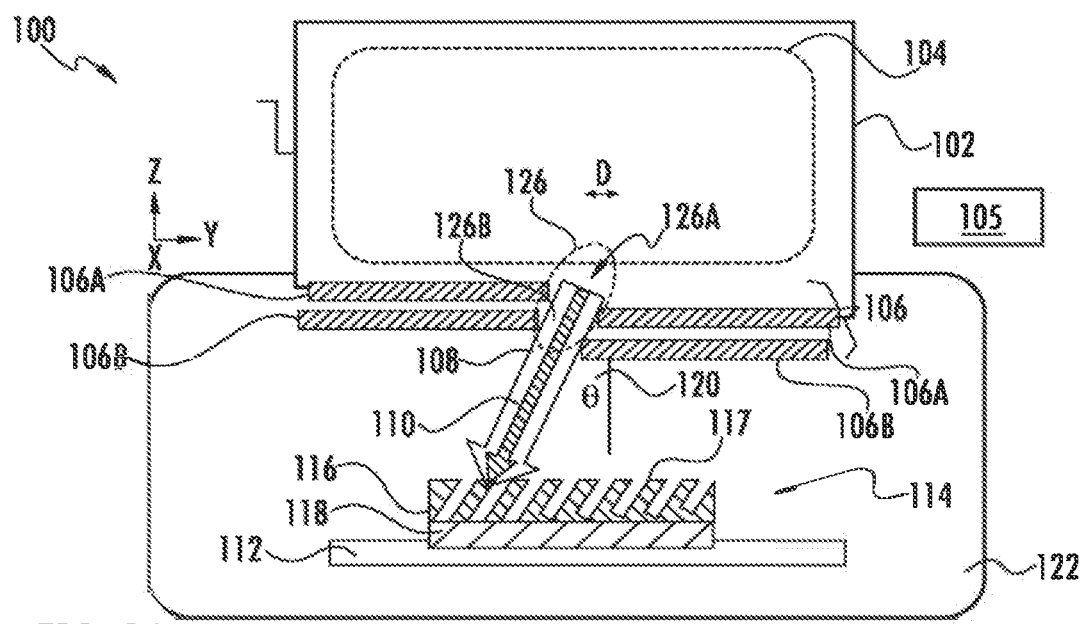
FIG. 1A and FIG. 1B show a schematic view of an exemplary system.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In various embodiments, novel plasma sources are provided, including a multielectrode extraction assembly. In some embodiments, a multi-electrode extraction assembly of a plasma source is arranged in conjunction with a substrate holder to generate angled ions and angled radicals that impinge upon the substrate at a non-zero angle of incidence with respect a perpendicular to a substrate plane. The multi-electrode extraction apparatus may be arranged wherein energetic ions and radicals are generated so the flux of radicals and ions are co-linear, the mean angle of both the radical flux and ion flux are the same, and the angle spread of these two flux are similar.

In some non-limiting embodiments, a tightly controlled angled etching process is provided, for angled etching of trenches, lines, or holes, where the sidewall geometry needs to be tightly controlled. In some embodiments angled etching to form angled optical grating structures is disclosed, using a novel plasma source, while in additional embodiments, the novel plasma source is used to generate contact holes and trenches with near parallel sidewalls and at high aspect ratios. Various additional embodiments provide etching approaches to define angled features where the cross sections of the angled features resemble parallelograms. These novel device structures are enabled because the apparatus including novel ion source and extraction assembly overcomes problems with known etching sources, where the radical flux vectors do not match the ion flux vectors, leading to generating an etched structure with non-parallel sidewalls.

In other embodiments, plasma sources including multi-electrode extraction assembly are provided to perform variable angle processing as described herein below. In some embodiments, an electrode is divided into two portions. Applying a voltage shift to create a vertically steering electric field may be performed, or by physically shifting an extraction element asymmetrically to create a similar steering electric field may be created.

Figure 1B:
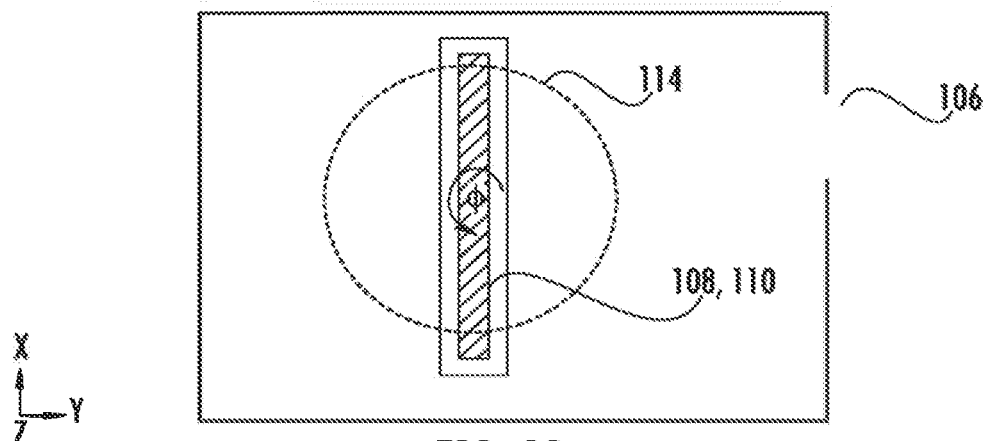

FIG. 1A illustrates a general cross section of a system 100 according to embodiments of the disclosure. The system 100 includes an ion source 102, which source may be configured as a plasma chamber, to generate a plasma 104. The ion source 102 may include or may be coupled to an extraction assembly 106, such as a diode, triode, or tetrode extraction assembly, according to various non-limiting embodiments. In various embodiments, the extraction assembly 106 may include generally rectangular and elongated extraction apertures to generate an angled ion beam 110, having a generally rectangular cross-section, as shown in FIG. 1B. The aspect ratio of the extraction apertures, as well as the ion beam (X-dimension/Y-dimension) may be 2/1, 3/1, 5/1, 10/1, 50/1, 100/1 or greater according to various non-limiting embodiments. In various non limiting embodiments, the ion source 102 may be configured as an RF plasma chamber, while other types of ion source chambers are possible, including indirectly heated cathode sources, microwave sources, or other known sources. While not shown in FIG. 1B, in some embodiments, the extraction assembly 106 may be a triode arrangement including extraction, suppression, and ground apertures. The embodiments are not limited in this context.

In various non-limiting embodiments, the ion source 102 may be coupled to receive gases from at least one gas source (not shown), so the plasma 104 may include either a noble gas, nitrogen, oxygen, hydrogen, hydrocarbons $C_yH_x$, halogen containing molecules (($C_xF_y$, $NF_x$, $SF_x$, etc.), or any combination of the above. In various implementations, the ion source 102 may be biased with respect to a substrate 114 (shown disposed on a substrate stage 112) at a given extraction potential, to generate the angled ion beam 110 at a given ion energy. The substrate 114 may be arranged in a process chamber 122, as shown. In the embodiment shown in FIG. 1A, the extraction assembly includes a first electrode 106A disposed immediately adjacent the side of the plasma chamber formed by ion source 102, and further includes a second electrode 106B. The first electrode 106A, as well as the second electrode 106B, may lie parallel to a first plane, such as a plane parallel to the X-Y plane of the Cartesian coordinate system shown. As shown in FIG. 1A, the second electrode 106B defines a vertical displacement from the first electrode 106A along a first direction (along the Z-axis of the Cartesian coordinate system shown), perpendicular to the first plane. This displacement may be on the order of a few millimeters up to several centimeters according to various non-limiting embodiments.

As shown, in FIG. 1A, the first electrode 106A includes a first aperture 126A, while the second electrode 106B includes a second aperture 126B, where the first aperture 126A defines a lateral displacement, shown as D, from the second aperture 126B along a second direction, parallel to the first plane. In this example, the second direction lies along the Y-axis. The vertical displacement between first electrode 106A and second electrode 106B, and the lateral displacement between first aperture 126A and second aperture 126B define a non-zero angle of inclination θ with respect to a perpendicular 120 to the first plane (X-Y plane). In other words, the first aperture 126A is displaced from the second aperture 126B along the Z-axis and along the Y-axis, so the shift between apertures in the Z-Y plane defines a non-zero angle of inclination θ with respect to the Z-axis, as indicated in FIG. 1A. As such, the first aperture 126A, second aperture 126B and the space between apertures may be said to define an angled extraction tunnel 126, having an axis aligned at the non-zero angle of inclination θ. Moreover, the angled ion beam 110 may also be directed through the angled extraction tunnel 126 and to the substrate 114 along a non-zero angle of incidence that is coincident with the non-zero angle of inclination θ of the angled extraction tunnel 126. Thus, in some embodiments, the center of the angled ion beam 110 may generally lie along the axis of the angled extraction tunnel 126. In various non-limiting embodiments, the value of θ may vary between 5 degrees and 85 degrees.

In addition to generating ions, the plasma 104 may generate non-ionized species, such as a plurality of radicals, wherein the plurality of radicals are directed through the angled extraction tunnel 126 as a radical beam 108, having a beam trajectory matching the non-zero angle of incidence θ of the angled ion beam 110. This geometry is generally shown in FIG. 1A, where the radical beam 108 is depicted as the open arrow. The radical beam 108 may include neutrals. In some non-limiting examples, reactive radicals are generated from halogen containing molecular gases ($C_xF_y$, $NF_x$, $SF_x$, etc.), in addition to a mix of other gases (noble gases, oxygen, nitrogen, hydrogen, hydrocarbons $C_yH_x$, etc.). For example, the input gas to ion source 102 may include $CF_4$ (carbon tetrafluoride). Undissociated $CF_4$ is very inert (like inert argon or $N_2$), but when dissociated in the plasma 104 (by the plasmas energetic electrons) the parent $CF_4$ will be broken up into daughter fragments such as $CF_3$, $CF_2$, CF, F, C. The fluorine containing daughter fragments that now have an open bond are chemically reactive and useful for a surface etching process. In addition to generating neutral CFx radicals, there will also be ionized radicals such as $CFx^+$ as well (which radicals may form part of the angled ion beam 110), while the overall flux in radical beam 108 may be mostly neutrals in various embodiments.

While the radical beam 108 is not subject to electrical manipulation by the extraction assembly 106 due to the neutral character of the species of radical beam 108, the radical beam 108 may be collimated as the radical beam 108 traverses through the angled extraction tunnel 126.

Thus, the multiple apertures of angled extraction tunnel 126, by collimating radical flux that exits the plasma 104, so as to be parallel with and colinear with energetic ion flux of the angled ion beam 110, provides processing capability not found in known plasma-based ion beam tools, where effusing radicals (neutrals) may not necessarily follow the trajectory of ions in the ion beam.

As an example of application of the system 100, reactive angled ion beam etching may be performed to etch angled structures in a substrate, using a reactive plasma generated in the ion source 102. As such, the angled ion beam 110 and radical beam 108 may act in concert to form an angled reactive ion etching beam to perform reactive ion etching of the substrate 114. As shown in FIG. 1A, the substrate 114 may include a substrate base 118, and a layer 116, disposed on the substrate base 118. The layer 116 may be any suitable layer to be etched to form, for example, a device structure. In one example, the layer 116 may be an optical grating layer. As such, a grating may be created in the layer 116 by etching structures within the layer 116. In some embodiments, angled structures 117 may be etched into the layer 116, where the angle of inclination of the angled structures 117 may match the non-zero angle of incidence of the angled ion beam 110 and radical beam 108.

Because the ion species of angled ion beam 110 and the radical flux of radical beam 108 may be directed along the same average trajectory (parallel to the non-zero angle of inclination θ), and may be collimated to limit the divergence of the respective beams, etching of the layer 116 may be collimated so that the sidewalls of the angled structures 117 are linear or flat and lie parallel to one another. Notably, the size of the angled structures 117 may not be drawn to scale, where the dimensions along the Z-axis, as well as Y-axis may be on the order of micrometers, or sub-micrometer dimension. The embodiments are not limited in this context. By providing the ability to etch angled structures 117, having parallel sidewalls, superior control of properties of a grating is provided, such as optical properties of an optical grating.

In various embodiments, the substrate stage 112 may be scannable so the substrate 114 may be scanned along the Y axis, for example, where the main substrate surface is arranged parallel to the X-Y plane during scanning. In this manner, an entirety of the substrate 114 may be exposed to the angled ion beam 110 and radical beam 108, as a result of scanning the substrate 114 is scanned, while just a rectangular portion (see shaded area of FIG. 1B) of the substrate 114 is exposed to ion flux or radical flux at any given instance. An additional feature provided by the scanning of the substrate stage 112 is the ability to tune or adjust an etching operation provided by the angled ion beam 110 and radical beam 108, as a function of position on the substrate 114.

Figure 1C:
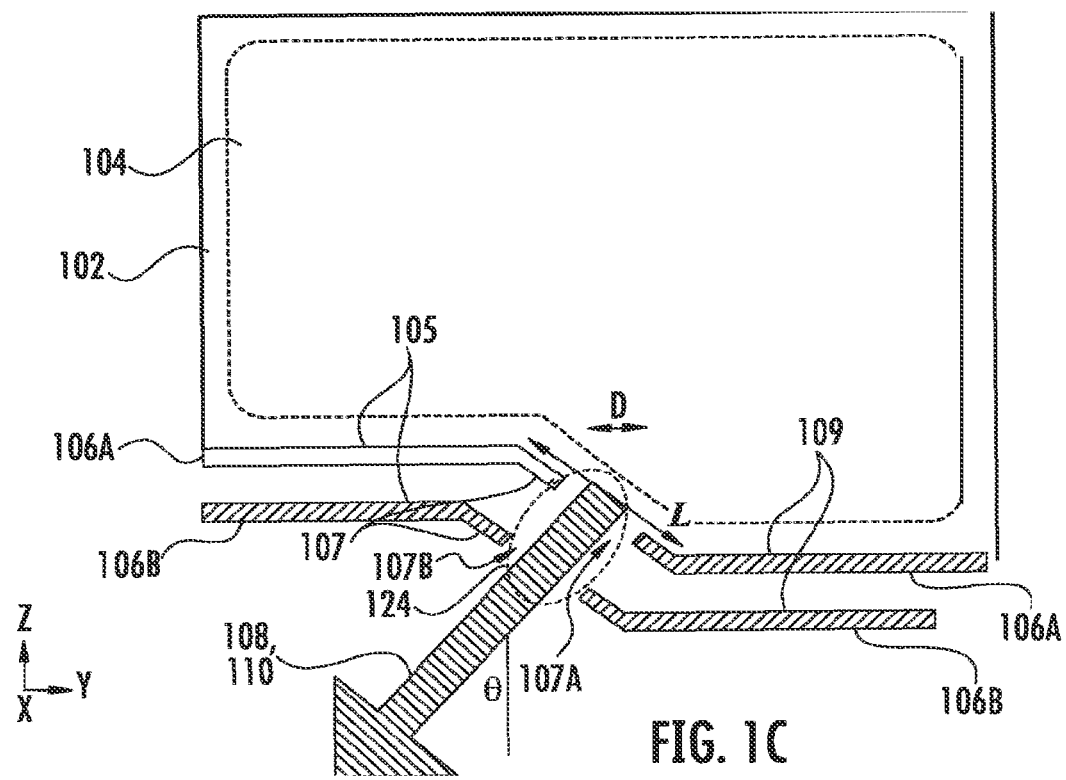
FIG. 1C shows details of an extraction assembly, according to embodiments of the disclosure.

FIG. 1C illustrates details of an embodiment of the extraction assembly 106. As shown, the extraction assembly is a two-electrode assembly including the first electrode 106A with first aperture 126A, while the second electrode 106B includes the second aperture 126B. The electrodes of the extraction assembly are staggered (defining a staggered shape), each electrode having an upper portion 105, an angled portion 107, and a lower portion 109, where the upper portion 105 and lower portion 109 lie parallel to the X-Y plane, while the angled portion 107 forms a non-zero angle of inclination with respect to the X-Y plane. The angled portion 107 of first electrode 106A and the second electrode 106B includes an aperture 107A and an aperture 107B, respectively. The aperture 107A is laterally displaced (see displacement represented by D) along the Y-direction with respect to the aperture 107B. the aperture 107A and aperture 107B may be elongated along a width direction (the X-direction), as generally shown in FIG. 1B. The angled portion may extend to a length L of 20 mm to 50 mm, while a height of the aperture 107A and 107B may be on the order of 5 mm to 20 mm in various non-limiting embodiments.

In addition, the apertures may be said to be angled in that a given aperture may be considered to extend along a plane of the angled portion. As such, an electric field defined by the voltage difference between the first electrode 106A and the second electrode 106B is aligned along a non-zero angle of incidence (with respect to a perpendicular to the X-Y plane, and also with respect to the plane of the upper portion 105 and lower portion 109), shown as θ, generally perpendicular to the angle of inclination of the angled portions 107. Thus, by arranging the angled portion 107 at the appropriate angle of inclination, angled ion beams may be directed at a desired angle with respect to a substrate where the plane of the substrate parallel to the X-Y plane.

Figure 1D:
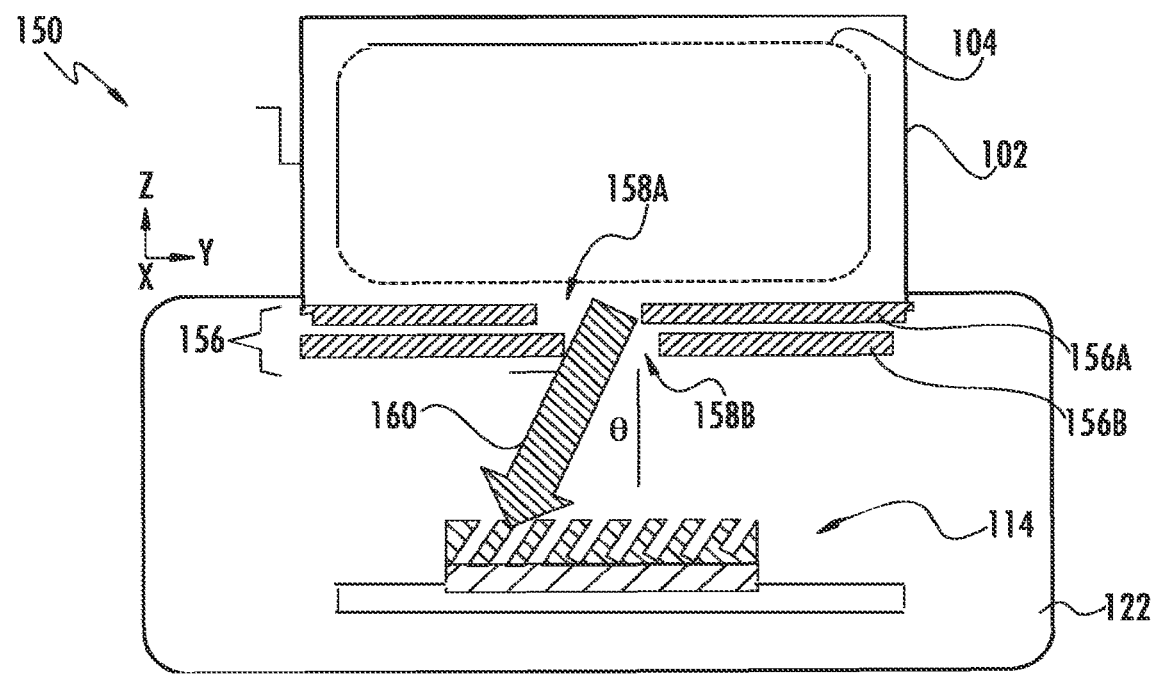
FIG. 1D shows details of another extraction assembly, according to embodiments of the disclosure.

Notably, in other embodiments, an angled ion beam may be generated using planar electrodes, as shown in FIG. 1D. In this example, a planar extraction assembly 156, includes a first electrode 156A and a second electrode 156B that lie parallel to the X-Y plane, where a lateral displacement within the X-Y plane takes place for aperture 158A with respect to aperture 158B, along the Y-direction second direction, parallel to the first plane. As shown in FIG. 1D, the shifting of the apertures with respect to one another has the effect of shifting the angle of incidence of an ion beam 160, in an opposite manner, due to the direction of electric fields that are established. Thus, the embodiment of FIG. 1D exhibits limitations in that the shifting of apertures may pinch off an ion beam that is accelerated in the opposite direction. Additionally, neutral or radical flux extracted from ion source 102 will not align with the direction of the ion beam 160, but tend to travel in a different direction.

Figure 2A:
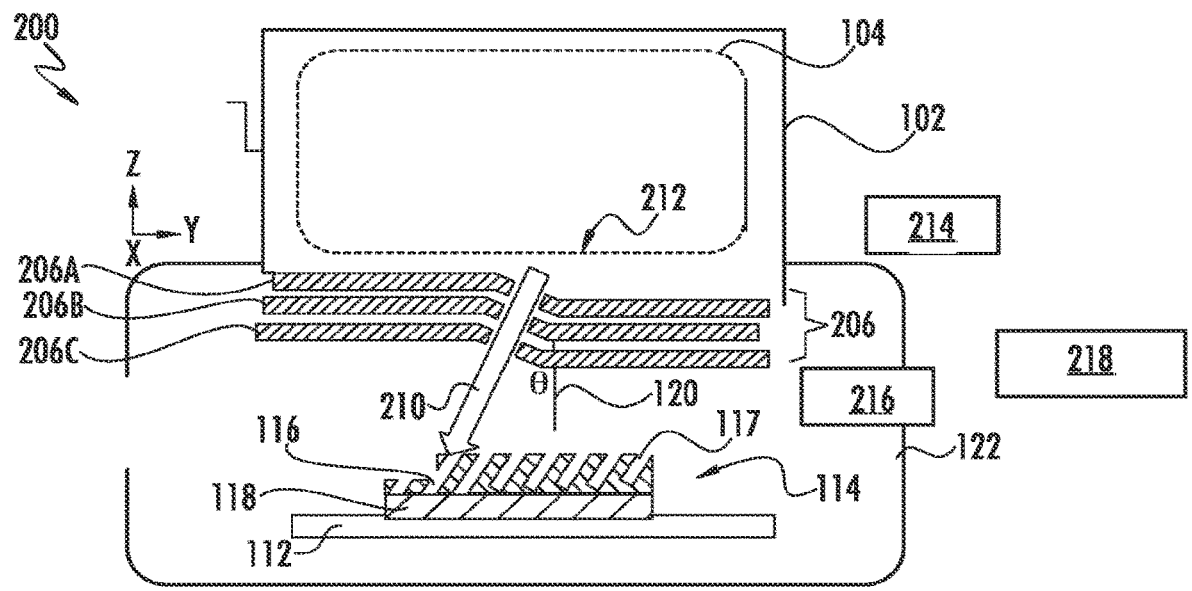
FIG. 2A and FIG. 2B show a schematic view of an exemplary system.
Figure 2B:
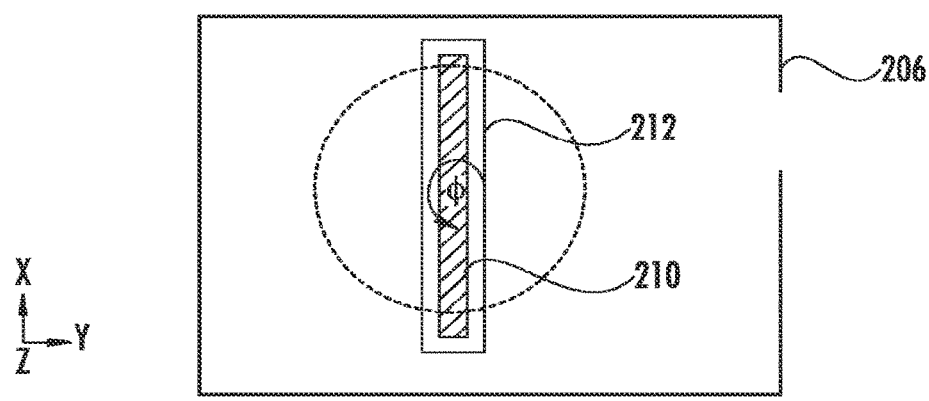

In additional embodiments of the disclosure, systems and processing apparatus may be provided with a multi-electrode extraction assembly, having the capability for in-situ angle adjustability of beam angle about a physical mean angle. Turning now to FIG. 2A, there is shown a general cross section of a system 200 according to embodiments of the disclosure. The system 200 may include various components described hereinabove with respect to system 100, where like components are labeled the same. As with system 100, an extraction assembly is provided, adjacent to the ion source 102. In this case, an extraction assembly 206 is shown, having three electrodes, while a two-electrode (diode) or four-electrode (tetrode) arrangement are possible according to other non-limiting embodiments. In various embodiments, the extraction assembly 206 may include generally rectangular and elongated extraction apertures to generate an angled ion beam 210, having a generally rectangular cross-section, as shown in FIG. 2B. The aspect ratio of the extraction apertures, as well as the ion beam (X-dimension/Y-dimension) may be 2/1, 3/1, 5/1, 10/1, 50/1, 100/1 or greater according to various non-limiting embodiments. In various embodiments, the ion source 102 may be configured as an RF plasma chamber, while other types of ion source chambers are possible.

In various implementations, the ion source 102 may be biased with respect to a substrate 114 (shown disposed on a substrate stage 112) at a given extraction potential using an extraction power supply 214, to generate the angled ion beam 210 at a given ion energy. The substrate 114 may be arranged in a process chamber 122, as shown. In the embodiment shown in FIG. 2A, the extraction assembly 206 includes a first electrode 206A, disposed immediately adjacent the side of the plasma chamber, formed by ion source 102, a second electrode 206B, and a third electrode 206C. These electrodes may be displaced from one another in a manner similar to that described with respect to extraction assembly 106, such as in FIG. 1C, so as to define a non-zero angle of inclination θ in the extraction assembly 206, which geometry may impart a non-zero angle of incidence to angled ion beam 210 that is coincident with the non-zero angle of inclination θ. In various non-limiting embodiments, the value of θ may vary between 5 degrees and 85 degrees. In one embodiment, the first electrode 206A may be set at positive potential, the second electrode 206B may be set at negative potential with respect to ground, and the third electrode 206C may be set at ground.

In addition to providing an extraction voltage to extract the angled ion beam 210, the extraction power supply 214 may supply voltages individually to one or more electrode of the extraction assembly 206, to manipulate electric fields in the aperture region 212 of the extraction assembly 206. In this manner, while the mutual offset of the apertures in first electrode 206A, second electrode 206B, and third electrode 206C, may set a first angle of incidence for the angled ion beam 210, shown as θ, the extraction power supply 214 may adjust or tweak the value of θ by supplying voltages individually to the electrodes. For example, in some embodiments, the extraction power supply 214 and extraction assembly 206 may provide for θ having an average value of 45 degrees with an adjustability to vary θ between 40 to 50 degrees.

In various embodiments, the adjustment of the value of θ may be provided dynamically, during exposure of the substrate 114 to the angled ion beam 210. This dynamic adjustment allows for different portions of the substrate 114 to be treated differently by the angled ion beam 210. For example, as discussed previously with respect to system 100, the substrate stage 112 may be scannable at least along the Y-axis. Thus, by adjusting electrode potentials applied to different electrodes of the extraction assembly 206 during scanning of the substrate 114, the angled ion beam 210 may impact the substrate 114 with a different angle of incidence with respect to the perpendicular 120 in the different regions. This ability to adjust dynamically may allow the average angle of inclination of angled structures to be varied across the substrate 114.

As further shown in FIG. 2A, the system 200 may include an electrode drive 216, coupled to the extraction assembly 206. In particular, the electrode drive 216 may be coupled to one or more of the electrodes of the extraction assembly 206. The electrode drive 216 may mechanically shift, for example along the Y-axis, at least one of the electrodes of the extraction assembly 206, with respect to the other electrodes, so as to change the relative position of the respective apertures of the extraction assembly, and accordingly change value of the angle of inclination. According to some embodiments, the adjustment of the value of θ by the electrode drive 216 may be provided dynamically, during exposure of the substrate 114 to the angled ion beam 210, similarly to the dynamic adjustment using the extraction power supply 214, described above.

To facilitate adjustment of the value of θ, such as dynamic adjustment, the system 200 may include a controller 218, where the controller 218 may be coupled to one or more components, such as the extraction power supply 214, the electrode drive 216, or the substrate stage 112. In dynamic operation the controller 218 may control the extraction power supply 214, the electrode drive 216, or a combination of the two, to change the value of θ during exposure to an angled ion beam, such as during scanning of the substrate stage 112.

Figure 3A:
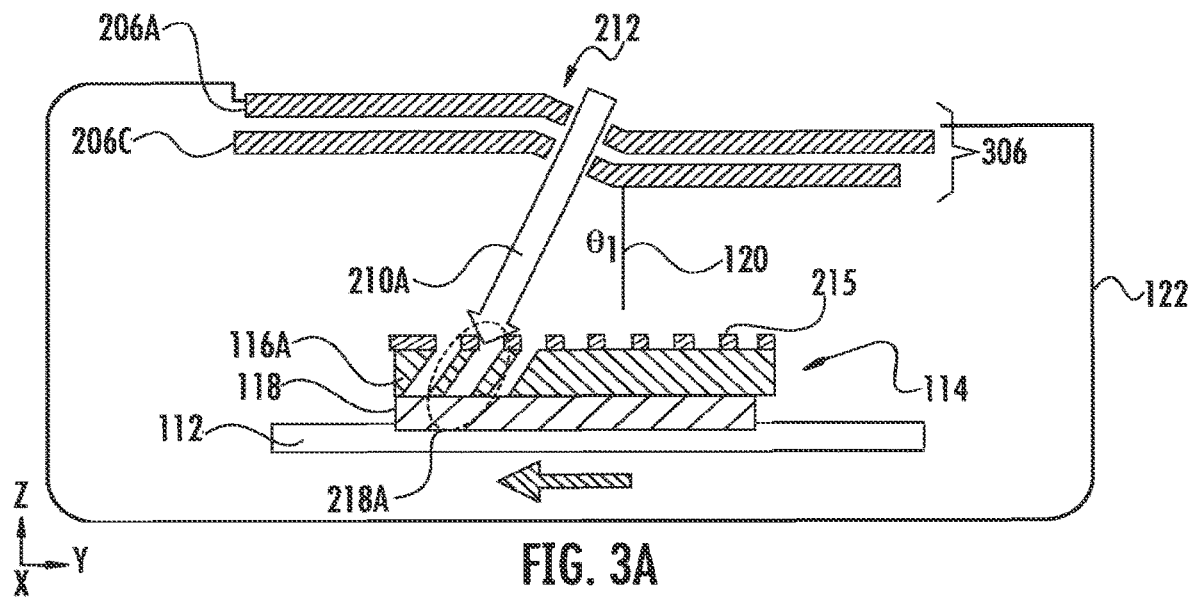
FIG. 3A and FIG. 3B show the geometry of an operation according to embodiments of the disclosure, at two different instances.
Figure 3B:
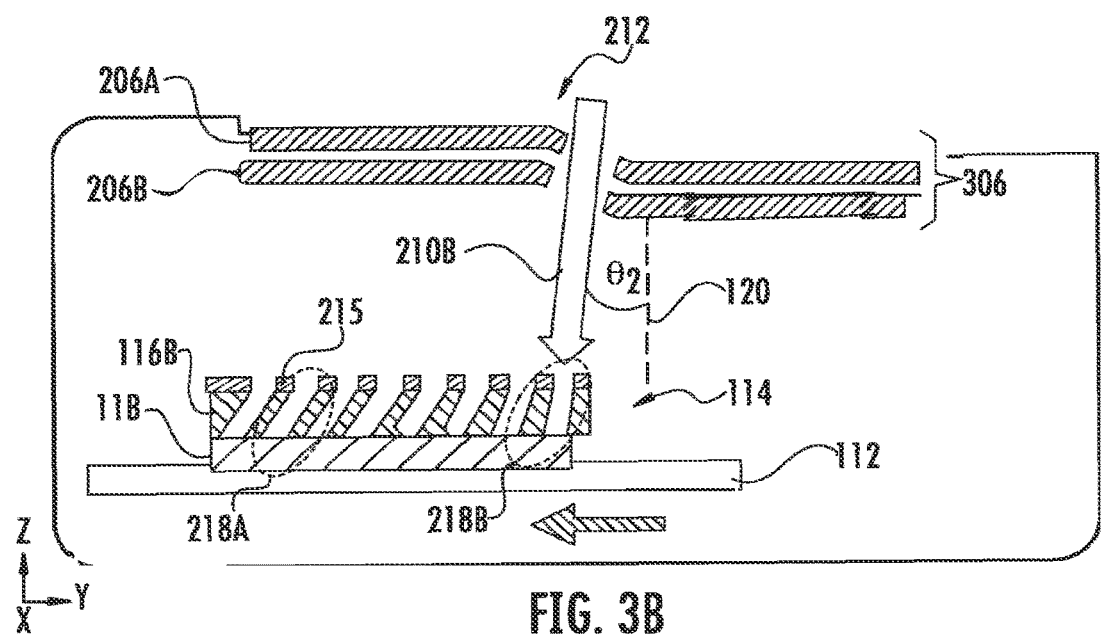

Turning to FIG. 3A and FIG. 3B there is shown the geometry of a processing operation according to embodiments of the disclosure, at two different instances. In the scenario of FIG. 3A and FIG. 3B etching of the layer 116 is shown at different stages. The extraction assembly of FIG. 3A uses the first electrode 206A and third electrode 206C, coupled to positive potential and to ground, respectively. In FIG. 3A, the layer 116, described above, is shown at an early stage of processing, and is labeled as layer 116A. A grating mask 215 is provided on the top surface of the layer 116, to define angled structures within the layer 116, when the layer 116 is subjected to reactive angled ion etching. The grating mask 215 and the layer 116 may be any suitable combination of different materials as known in the art, so that selective etching of the layer 116 is accomplished by the appropriate reactive ion etching chemistry provided in conjunction with an angled ion beam. For example, the layer 116 may be an oxide, while the grating mask 215 is a nitride or carbon-based material. In the scenario of FIG. 3A, an angled ion beam 210A is directed to the layer 116 at a first non-zero angle of incidence (with respect to the Z-axis), shown as $\theta_1$. At the same time, the substrate 114 may be scanned along the Y-axis to the left, as indicated by the solid arrow. At this instance, a portion of the layer 116 has been exposed to the angled ion beam 210A, so as to etch the angled structures 218A, where the angled structures 218A may have sidewalls oriented at or close to the value of $\theta_1$.

In the scenario of FIG. 3B, the substrate 114 has been scanned along the Y-axis further to the left, so an entirety of the layer 116, now depicted as layer 116B, has been exposed to an ion beam at the instance of FIG. 3B. In FIG. 3B, the electrodes of extraction assembly 206 have been shifted with respect to one another. At this instance, an angled ion beam 210B is directed to the layer 116 at a second non-zero angle of incidence (with respect to the Z-axis), shown as $\theta_2$, having a value in this case less than the value of $\theta_1$. The result in the decrease in the angle of incidence is to etch the angled structures 218B, with steeper sidewalls that may be oriented at or close to the value of $\theta_2$ As such the layer 116B provides an angled grating having angled structures where the angle of inclination varies according to position along the Y-axis.

As noted above, the system 200 provides the capability to vary the angle of inclination of an extraction tunnel of the extraction assembly 206, or to otherwise manipulate the electrodes of extraction assembly 206 so as to dynamically vary the angle of incidence of an ion beam, such as in-situ during exposure to the ion beam. In the same manner, the extraction assembly 306 may be manipulated, so as to manipulate the non-zero angle of incidence, in situ, during substrate processing. Thus, the layer 116B may be generated by scanning the substrate 114 while adjusting the extraction assembly 306, so the resulting structure of layer 116B is generated in a dynamic manner. In various embodiments, the angle of incidence of an angled ion beam generated by the system 200 may be varied in a continuous fashion, in a step-like fashion, in a combination of continuous and step-like fashion, or according to any suitable predetermined profile for changing the angle of inclination of angled structures in a layer, as a function of position along a substrate.

Likewise, in embodiments having a planar extraction assembly, such as planar extraction assembly 156, the electrical parameters of the plasma, extraction voltage system, or relative positioning of the electrodes may be varied to dynamically vary the non-zero angle of incidence of an extracted ion beam.

While not explicitly shown, in further embodiments, the angle of incidence of an angled radical beam may be varied in a similar fashion to the operation shown in FIG. 3A and FIG. 3B for an angled ion beam. In some examples, where the apertures within the different electrodes are shifted systematically to change the angle of inclination of the axis of an angled extraction tunnel, the change in the angle of incidence of a radical beam may inherently change with change in angle of inclination of the extraction tunnel. In other words, because the angled extraction tunnel physically confines the trajectories of neutrals emitted from the ion source, the change in the relative position of apertures that changes the angle of inclination of the extraction tunnel will also change the average direction of neutrals such as radicals, emitted from the ion source. In other embodiments, where electrostatic deflection is applied to one or more electrodes of the extraction assembly 206 to change the angle of incidence of an angled ion beam, the angle of incidence of an angled radical beam may not necessarily change in a concomitant manner, since the angled radical beam may be wholly composed of neutral species.

Moreover, while the operation shown in FIG. 3A and FIG. 3B suggests the left portion of a substrate may be completely etched before etching commences in the right portion, so the final structure of gratings is defined in a single scan of the substrate, according to various embodiments, a non-uniform etch operation may be performed in multiple scans. Thus, the average angle of incidence of angled structures across a substrate may be varied by repeatedly performing the same etch recipe to vary the angle of incidence across the substrate in multiple scans.

Figure 4:
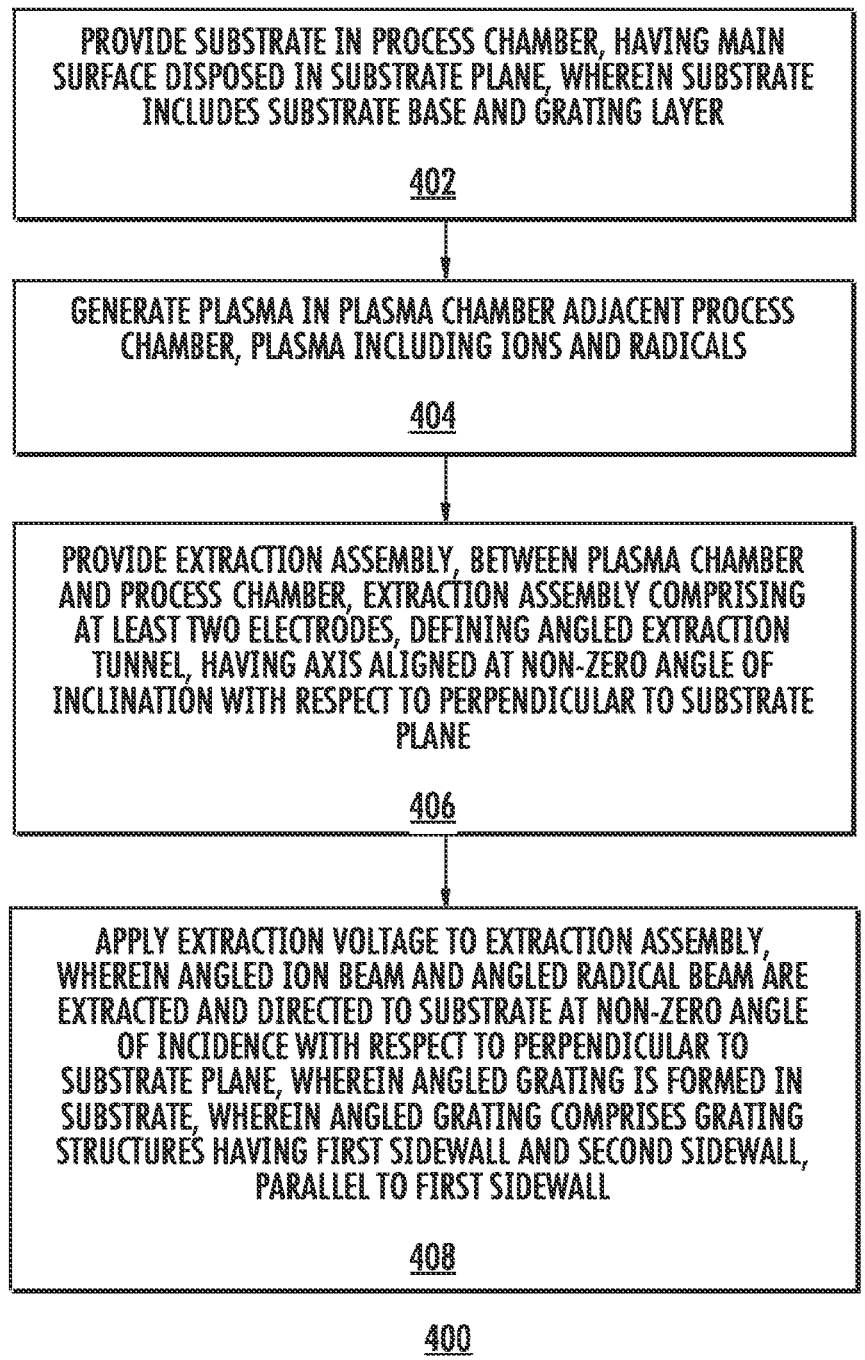
FIG. 4 presents a process flow, according to embodiments of the disclosure.

FIG. 4 depicts a process flow 400, in accordance with various embodiments of the disclosure. At block 402, a substrate is provided in a process chamber, where the substrate is arranged to have a main surface within a substrate plane. The substrate may include a substrate base and a layer, disposed on the substrate base, such as a grating layer. At block 404, a plasma is generated in a plasma chamber, adjacent the process chamber, where the plasma includes ions and radicals.

At block 406, an extraction assembly is provided between the plasma chamber and the process chamber. The extraction assembly may be arranged to extend from a side of the plasma chamber in some embodiments. According to various embodiments, the extraction assembly may include at least two electrodes, such as three electrodes, or four electrodes. An aperture may be disposed within each electrode, wherein the apertures in the different electrodes are arranged to define an angled extraction tunnel. The angled extraction tunnel may have an axis aligned along a non-zero angle of inclination with respect to a perpendicular to the substrate plane.

At block 408, an extraction voltage is applied to the extraction assembly, where an angled ion beam and a radical beam are extracted and directed to the substrate at a non-zero angle of incidence with respect to the perpendicular. The extraction voltage may be applied as a continuous voltage or a pulsed voltage in different embodiments. As such, the angled ion beam and radical beam may etch the grating layer to form an angled grating in the substrate, where the angled grating includes angled structures having a first sidewall and a second sidewall, parallel to the first sidewall.

Figure 5:
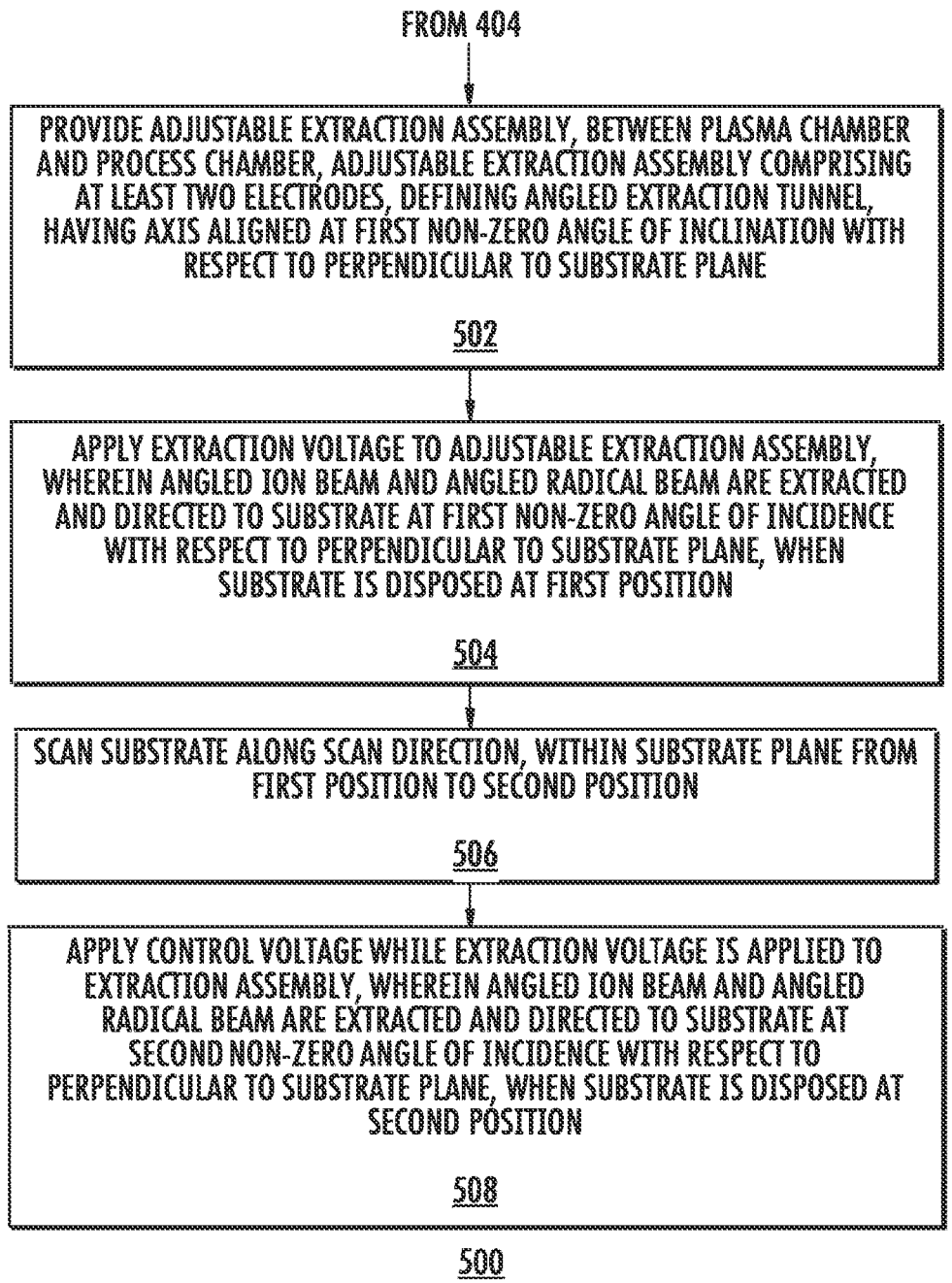
FIG. 5 presents another process flow, according to embodiments of the disclosure.

FIG. 5 depicts a further process flow, shown as process flow 500, in accordance with other embodiments of the disclosure. At block 502, the process proceeds from block 404, described above. In block 502, an adjustable extraction assembly is provided between the plasma chamber and process chamber, where the adjustable extraction assembly includes at least two electrodes that define an angled extraction tunnel, having an axis aligned at a first non-zero angle of inclination with respect to a perpendicular to the substrate plane.

At block 504, when the substrate is disposed at a first position, an extraction voltage is applied to the adjustable extraction assembly, wherein an angled ion beam is extracted and directed to the substrate at a first non-zero angle of incidence with respect to the perpendicular to substrate plane. In various non-limiting embodiments, the value of this angle of incidence may range from 5 degrees to 85 degrees.

At block 506, the substrate is scanned along a scan direction, lying within the substrate plane, from the first position to a second position.

At block 508, a control signal is applied to the extraction assembly, while the extraction voltage is applied, wherein the angled ion beam is extracted and directed to the substrate at a second non-zero angle of incidence with respect to the perpendicular to the substrate plane, when the substrate is disposed at the second position. In some examples, the control signal may be applied to adjust the voltage applied to one or more electrodes of the extraction assembly, so as to electrostatically deflect the angled ion beam through the angled extraction tunnel, and to change the trajectory of the angled ion beam, while not moving the electrodes of the angled extraction tunnel. In other embodiments, the control signal may be applied to an electrode drive to adjust the relative position of at least one electrode with respect to the other electrode(s) of the electrode assembly, and to alter the non-zero angle of inclination of the angled extraction tunnel. In still further embodiments, the control signal may change the voltage applied to at least one electrode, as well as the relative position of at least one electrode with respect to other electrodes of the electrode assembly.

The present embodiments provide various advantages compared to known processing apparatus to generate reactive ion beam etching. For one, the extraction assembly of the present embodiments provides a configuration where an angled ion beam as well as radical beam may be extracted at directed to a substrate, while preserving isocentric scanning using a simple linear scan of a substrate. In this sense, "isocentric scanning" refers to the scanning where the mechanical scan direction of a substrate is in a plane parallel to the surface of a substrate being processed. This advantage avoids processing different portions of a substrate with different beam density, for example, when the ion beam or radical beam exhibit beam divergence. In non-isocentric scanning where the scan direction may not lie parallel to the substrate plane, portions of the substrate further away from the beam source may receive less flux density from a diverging ion beam and/or radical beam. Another advantage of the present embodiments is the ability to accurately etch parallel and linear sidewalls due to the ability to direct collimated ion beam flux and radical beam flux from an extraction tunnel to a substrate. A further advantage lies in the ability to achieve higher beam currents, focusing control, and electron suppression in triode configurations of the present embodiments. Another advantage of embodiments of the disclosure is the ability to tune the angle of incidence of an angled ion beam and/or an angled radical beam, in-situ, allowing the generation of a novel etch process, such as a "rolling k vector" etch, to produce novel angled structures for use in optical gratings.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of patterning a substrate, comprising:
   providing the substrate, wherein a main surface of the substrate defines a substrate plane, wherein the substrate comprises a grating layer and a base layer, subjacent the grating layer;
   generating a plasma in a plasma chamber, adjacent to the substrate; and
   applying an extraction voltage to an extraction assembly, adjacent the plasma chamber, the extraction assembly comprising at least two electrodes, wherein a first electrode is disposed immediately adjacent a side of the plasma chamber, the side of the plasma chamber defining a first plane, wherein a second electrode defines a vertical displacement from the first electrode along a first direction, perpendicular to the first plane, wherein the at least two electrodes define an angled extraction tunnel, disposed at a non-zero angle of inclination with respect to a perpendicular to the substrate plane,
   wherein an angled ion beam is extracted from the extraction assembly, the angled ion beam defining a non-zero angle of incidence with respect to the substrate plane,
   wherein the angled ion beam etches the grating layer to form an angled grating; and
   wherein each of the first electrode and the second electrode have a staggered shape, and each electrode comprising an upper portion, an angled portion, and a lower portion, the upper portion and the lower portion being parallel to the first plane, wherein the angled portion is located between the upper portion and the lower portion with respect to the second direction, and wherein the lower portion and the angled portion are integral and continuous with one another.

2. The method of claim 1, wherein the non-zero angle of incidence is between 5 degrees and 85 degrees.

3. The method of claim 1, wherein the plasma generates a plurality of radicals, and wherein the plurality of radicals are directed through the angled extraction tunnel as a radical beam having a beam trajectory matching the non-zero angle of incidence of the angled ion beam.

4. The method of claim 3, further comprising providing a grating mask on the grating layer, wherein the angled ion beam and the radical beam comprise an angled reactive ion etching (RIE) beam, wherein the angled RIE beam etches the grating layer to form a plurality of grating structures, the plurality of grating structures defining a first angled sidewall and a second angled sidewall, the second angled sidewall being parallel to the first angled sidewall.

5. The method of claim 1, wherein the extraction assembly comprises a first electrode and a second electrode, wherein the first electrode comprises a first aperture, and the second electrode comprises a second aperture, wherein the first aperture defines a lateral displacement from the second aperture along a scan direction, parallel to the substrate plane, and wherein the first aperture and the second aperture are elongated in a width direction, perpendicular to the scan direction.

6. The method of claim 5, further comprising scanning the substrate along the scan direction while the angled ion beam etches the grating layer.

7. The method of claim 6, further comprising adjusting the extraction assembly to change the non-zero angle of incidence during the scanning.

8. The method of claim 7, wherein the adjusting the extraction assembly comprises shifting the first aperture with respect to the second aperture along the scan direction.

9. The method of claim 7, wherein the adjusting the extraction assembly comprises changing a voltage applied to at least one electrode of the extraction assembly.

10. The method of claim 7, further comprising providing a grating mask on the grating layer, wherein the angled ion beam etches the grating layer to form a plurality of grating structures, and wherein the adjusting the extraction assembly comprises adjusting an angle of inclination of the plurality of grating structures such that the angle of the inclination of the plurality of grating structures varies.

* * * * *